United States Patent
Chen et al.

(10) Patent No.: US 8,053,902 B2
(45) Date of Patent: Nov. 8, 2011

(54) ISOLATION STRUCTURE FOR PROTECTING DIELECTRIC LAYERS FROM DEGRADATION

(75) Inventors: Ming-Fa Chen, Taichung (TW); Sheng-Yuan Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 139 days.

(21) Appl. No.: 12/326,550

(22) Filed: Dec. 2, 2008

(65) Prior Publication Data
US 2010/0133696 A1 Jun. 3, 2010

(51) Int. Cl.
*H01L 23/12* (2006.01)
*H01L 23/48* (2006.01)
*H01L 23/52* (2006.01)
*H01L 29/40* (2006.01)

(52) U.S. Cl. ............... 257/776; 257/508; 257/E23.011; 257/E23.141

(58) Field of Classification Search .......... 257/508, 257/774, E23.011, E23.141, 776; 438/455, 438/469, 667
See application file for complete search history.

(56) References Cited

U.S. PATENT DOCUMENTS

| | | | |
|---|---|---|---|
| 7,224,060 B2 * | 5/2007 | Zhang et al. | 257/730 |
| 7,335,592 B2 | 2/2008 | Kim et al. | |
| 7,427,803 B2 | 9/2008 | Chao et al. | |
| 7,615,841 B2 | 11/2009 | Chen et al. | |
| 7,701,057 B1 | 4/2010 | Rahman et al. | |
| 2004/0150070 A1 * | 8/2004 | Okada et al. | 257/508 |
| 2006/0141653 A1 * | 6/2006 | Choi | 438/48 |
| 2008/0283959 A1 * | 11/2008 | Chen et al. | 257/508 |
| 2009/0127652 A1 | 5/2009 | Ding et al. | |
| 2009/0134500 A1 | 5/2009 | Kuo | |
| 2009/0191708 A1 * | 7/2009 | Kropewnicki et al. | 438/667 |

FOREIGN PATENT DOCUMENTS

| | | |
|---|---|---|
| CN | 1532924 A | 9/2004 |
| CN | 1858909 A | 11/2006 |

* cited by examiner

*Primary Examiner* — Wael Fahmy
*Assistant Examiner* — Quovaunda V Jefferson
(74) *Attorney, Agent, or Firm* — Slater & Matsil, L.L.P.

(57) ABSTRACT

An integrated circuit structure includes a semiconductor substrate; and an interconnect structure overlying the semiconductor substrate. A solid metal ring is formed in the interconnect structure, with substantially no active circuit being inside the solid metal ring. The integrated circuit structure further includes a through-silicon via (TSV) having a portion encircled by the solid metal ring. The TSV extends through the interconnect structure into the semiconductor substrate.

18 Claims, 12 Drawing Sheets

ISOLATION STRUCTURE FOR PROTECTING DIELECTRIC LAYERS FROM DEGRADATION

CROSS-REFERENCE TO RELATED APPLICATION

This application relates to commonly-assigned U.S. patent application Ser. No. 11/945,022, filed Nov. 26, 2007, and entitled "Structures for Preventing Cross-Talk between Through-Silicon Vias and Integrated Circuits," which application is hereby incorporated herein by reference.

TECHNICAL FIELD

This invention relates generally to integrated circuits, and more particularly to structures and methods for reducing the degradation of low-k dielectric layers caused by the formation of through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3DIC) and stacked dies are commonly used. Through-silicon vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

The formation of the TSVs requires more process steps. The integrated circuit formation thus becomes more complicated, and hence problems may occur. New methods for forming TSVs are thus needed to continuously improve the TSV formation process.

SUMMARY OF THE INVENTION

In accordance with one aspect of the present invention, an integrated circuit structure includes a semiconductor substrate; and an interconnect structure overlying the semiconductor substrate. A solid metal ring is formed in the interconnect structure, with substantially no active circuit being inside the solid metal ring. The integrated circuit structure further includes a through-silicon via (TSV) having a portion encircled by the solid metal ring. The TSV extends through the interconnect structure into the semiconductor substrate.

In accordance with another aspect of the present invention, an integrated circuit structure includes a semiconductor chip, which includes a semiconductor substrate; a plurality of low-k dielectric layers overlying the semiconductor substrate; and a non-low-k dielectric layer overlying the low-k dielectric layers, wherein the non-low-k dielectric layer and the plurality of low-k dielectric layers have an interface. The semiconductor chip further includes a TSV extending from a top surface of the non-low-k dielectric layer into the semiconductor substrate; and a solid metal ring in the plurality of low-k dielectric layers and forming a closed-loop ring encircling the TSV. The solid metal ring has a top surface no lower than the interface. The solid metal ring extends at least into a bottom one of the low-k dielectric layers. A seal ring encircles the solid metal ring and is adjacent to edges of the semiconductor chip. An active circuit is located between the seal ring and the solid metal ring.

In accordance with yet another aspect of the present invention, an integrated circuit structure includes a semiconductor substrate; an interconnect structure overlying the semiconductor substrate; and a solid metal ring in the interconnect structure, wherein substantially no active circuit is inside the solid metal ring. A plurality of TSVs is encircled by the solid metal ring. The plurality of TSVs extends through the interconnect structure and into the semiconductor substrate.

An advantageous feature of the present invention includes reduced degradation of low-k dielectric layers caused by the formation of through-silicon vias. Further, no additional manufacturing cost is required.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 6A are cross-sectional views of intermediate stages in the formation of an embodiment of the present invention, wherein solid metal rings are formed to encircle TSVs;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
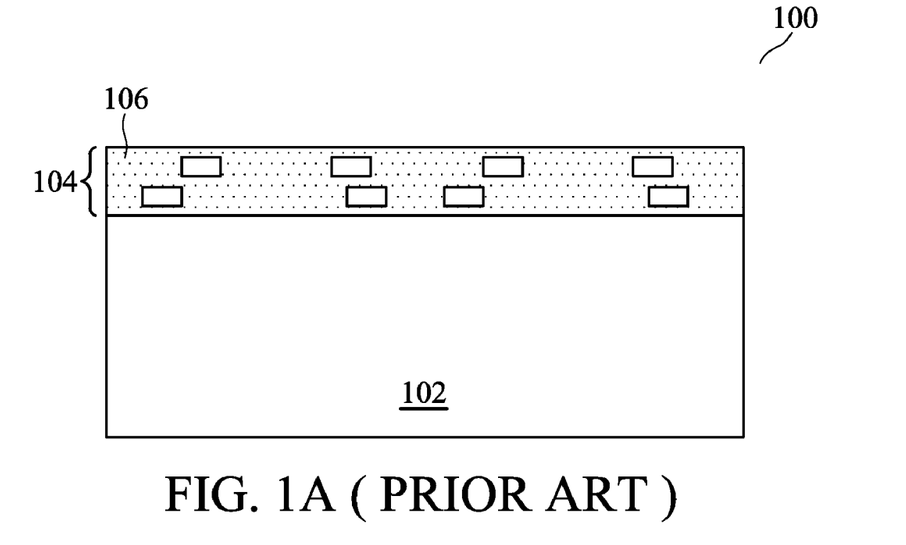
FIGS. 1A through 1D are cross-sectional views of intermediate stages in a conventional process for forming through-silicon vias (TSVs)
Figure 1B:
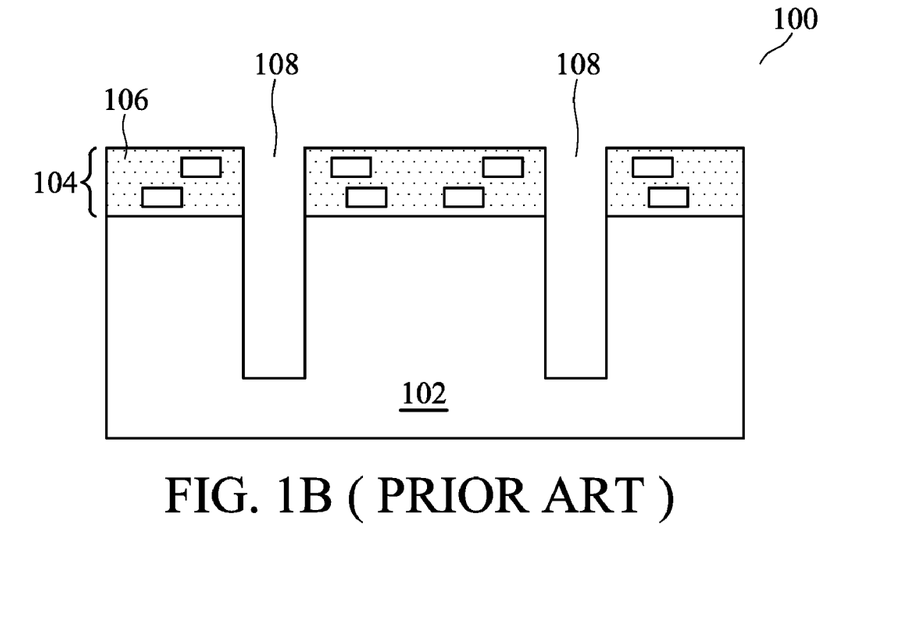
Figure 1C:
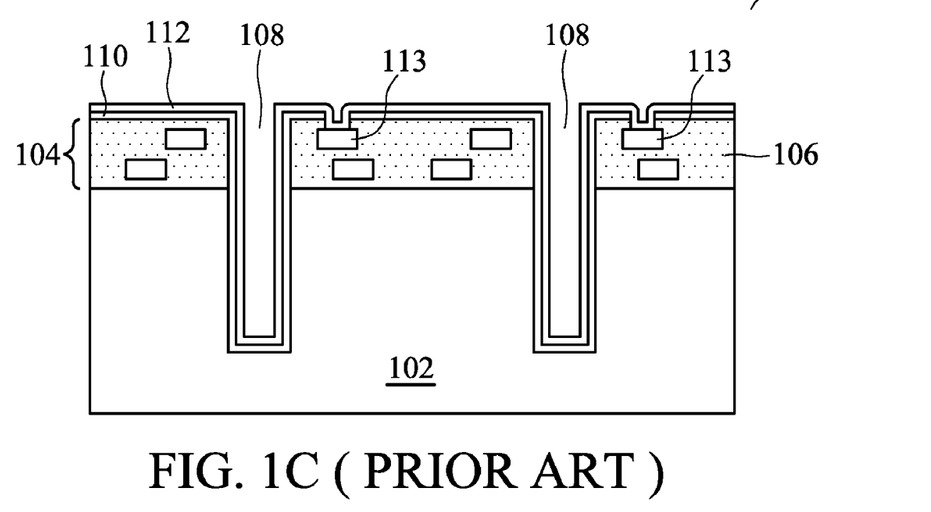
Figure 1D:
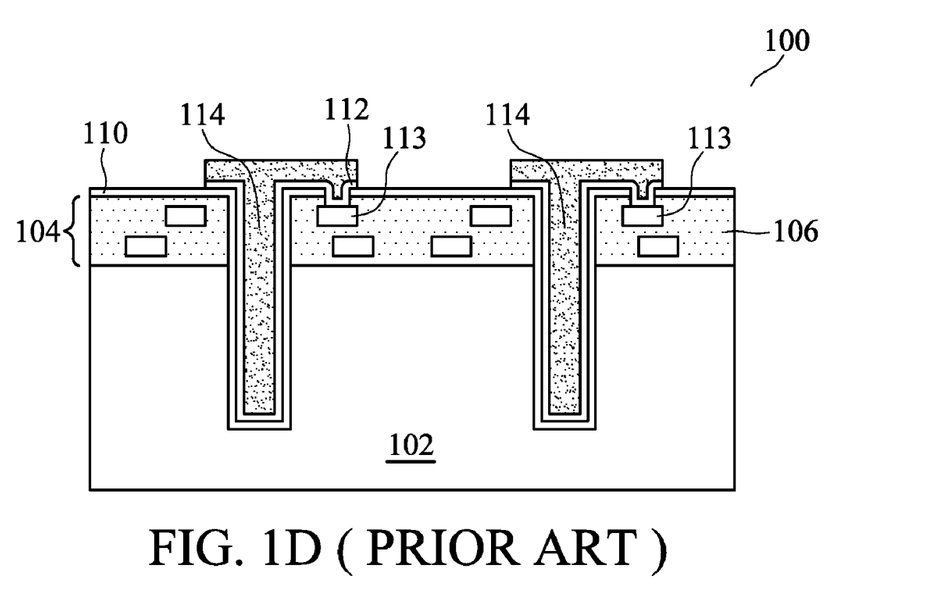

FIGS. 1A through 1D illustrate cross-sectional views of intermediate stages in the manufacturing of conventional through-silicon vias (TSVs) in a semiconductor chip. Referring to FIG. 1A, chip 100 is provided. Chip 100 includes semiconductor substrate 102 and interconnect structure 104 over semiconductor substrate 102. Interconnect structure 104 includes metal lines (shown as horizontal bars) and vias (not shown) formed in dielectric layers 106, which are typically low-k dielectric layers. In FIG. 1B, openings 108 are formed by etching low-k dielectric layers 106 and semiconductor substrate 102. In FIG. 1C, isolation layer 110 and barrier layer 112 are blanket formed, followed by removing the portions of isolation layer 110 covering bond pads 113. Next, as shown in FIG. 1D, a seed layer (not shown) is formed, followed by filling openings 108 to form TSVs 114.

Experiments preformed by inventors of the present invention have revealed that the leakage currents between the metal lines in low-k dielectric layers 106 often increase after the formation of TSVs 114, sometimes by as great as three orders. Particularly, in regions near TSVs 114, the increase in the leakage currents is more severe. It has been found that the increase in leakage currents is caused by the degradation of low-k dielectric layers 106, which is in turn caused by the moisture penetration during the TSV formation processes. Referring back to FIG. 1B, during the formation of TSVs 114, low-k dielectric layers 106 are exposed to the external environment through openings 108. Low-k dielectric layers 106 are porous, and may easily absorb detrimental substances such as moisture and chemicals. This causes the degradation of low-k dielectric layers 106. The degradation is further worsened by the use of extreme low-k (ELK) dielectric materials in low-k dielectric layers 106, which is even more porous, and has greater moisture absorption ability than the conventional low-k dielectric materials.

Further experiments have revealed that the leakage currents caused by the degradation of low-k dielectric layers 106 become less severe in regions away from TSVs 114. In regions away from TSVs 114 by greater than about 2000 µm, the leakage currents are reduced to acceptable levels. However, this means that significant portions (exclusion zones) of semiconductor chips are affected by the dielectric degradation, and are preferably not used for forming metal lines. A novel TSV structure and the method of forming the same are thus provided to solve the above-discussed problem. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 2:
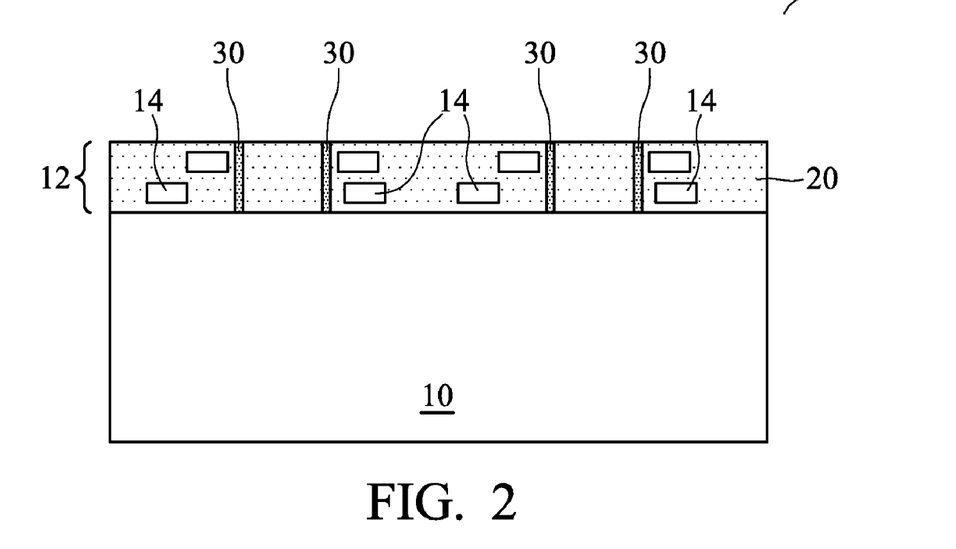

FIG. 2 illustrates a schematic cross-sectional view of chip 2. Chip 2 includes semiconductor substrate 10 and interconnect structure 12 over semiconductor substrate 10. Semiconductor substrate 10 is preferable formed of silicon, although other semiconductor materials such as SiGe may also be used. Active circuits (not shown in FIG. 2, symbolized by transistor 72 in FIG. 6B) including transistors, resistors, capacitors, and the like are formed on the surface of semiconductor substrate 10.

Figure 6A:
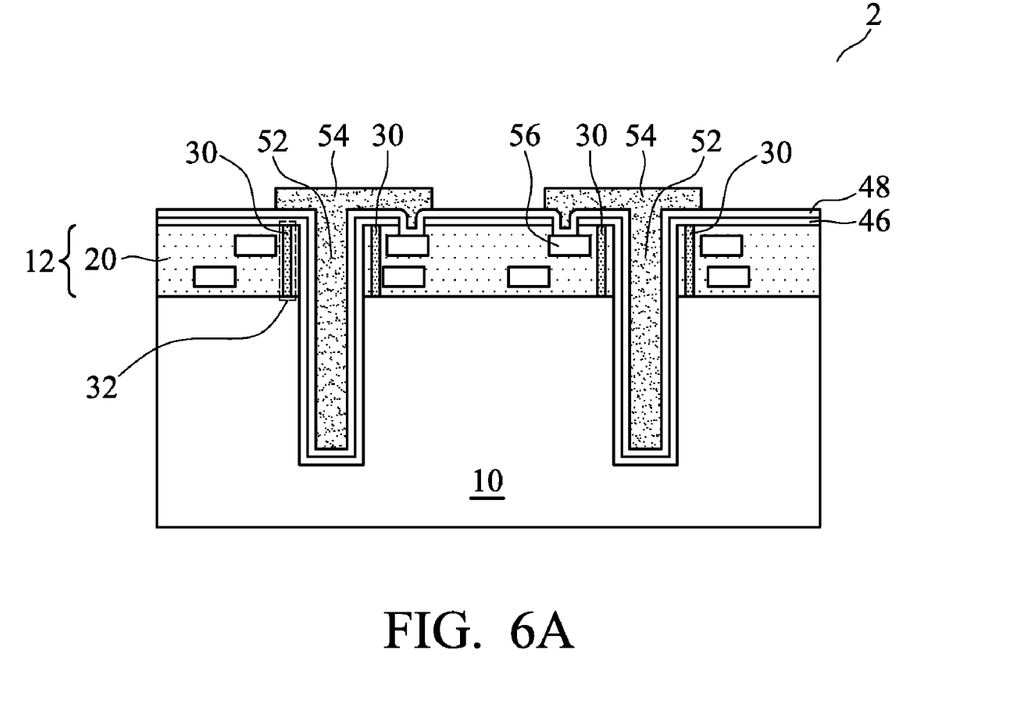
Figure 6B:
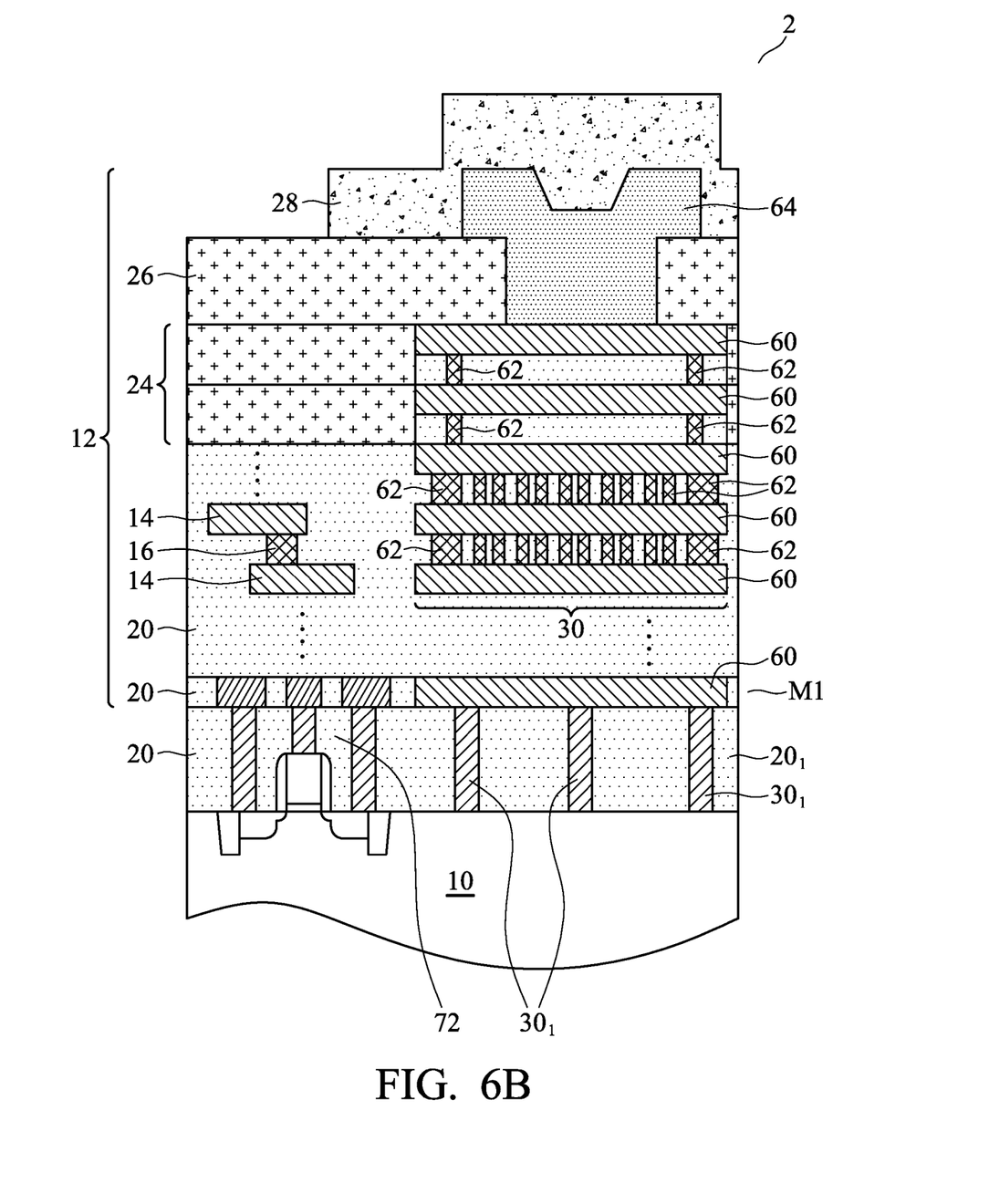
FIG. 6B illustrates a cross-sectional view of a portion of a chip, in which a solid metal ring is formed.

Interconnect structure 12 includes metallization layers stacked layer by layer, with metal lines 14 formed in the metallization layers, and vias 16 (not shown in FIG. 2A, refer to FIG. 6B) connecting metal lines 14. Interconnect structure 12 interconnects the integrated circuits formed on the top surface of semiconductor substrate 10, and connects the integrated circuits to bond pads (not shown) on the top surface of chip 2. Metal lines 14 and vias 16 are formed in dielectric layers 20, which are preferably low-k dielectric layers having dielectric constants (k values) less than about 3.5. More preferably, dielectric layers 20 are formed of extreme low-k dielectric materials having k values less than about 2.5. Interconnect structure 12 may further include upper dielectric layers on top of low-k dielectric layers 20, wherein the upper dielectric layers comprise non-low-k dielectric materials having no moisture absorption problem. The k values of the upper dielectric layers are greater than about 3.5, and more preferably greater than about 3.9. In an embodiment, as shown in FIG. 6B, the upper dielectric layers include un-doped silicate glass (USG) layers 24. Further, passivation layers including passivation layer 26 (commonly known as passivation one), and optionally passivation layer 28 (commonly known as passivation two), may also be included in interconnect structure 12. Solid metal rings 30 are formed in interconnect structure 12, with each of the solid metal rings 30 forming a solid fence for preventing the moisture from penetrating into low-k dielectric layers 20. The details of solid metal ring 30 are discussed in subsequent paragraphs.

Figure 3:
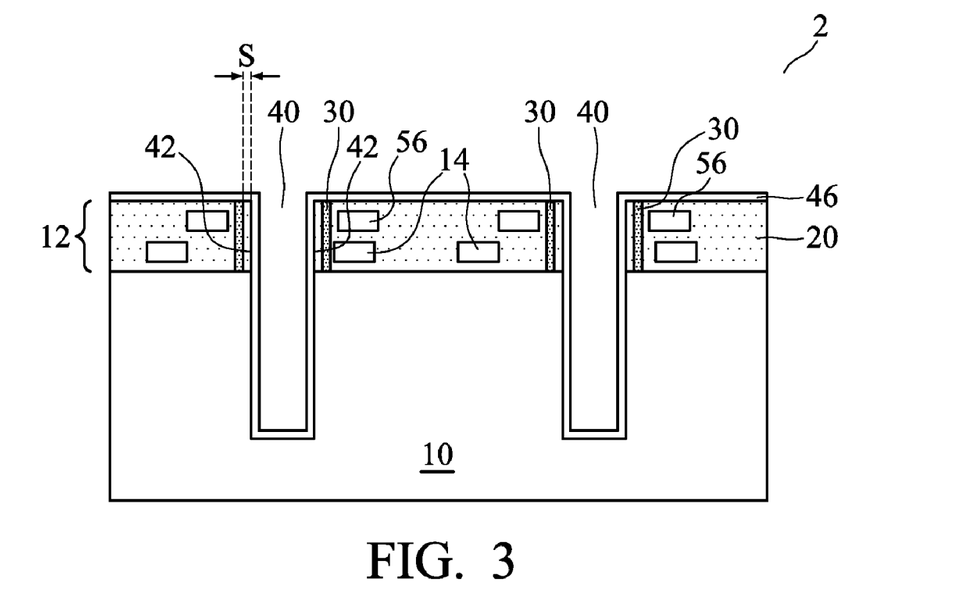

In FIG. 3, openings 40 are formed by etching dielectric layers including passivation layers 26 and 28 (refer to FIG. 6B), USG layers 24 (refer again to FIG. 6B), low-k dielectric layers 20, and semiconductor substrate 10. Openings 40 hence extend into semiconductor substrate 10. Preferably, edges 42 of openings 40 are spaced apart from the respective edges of solid metal rings 30 by a distance S, which is a margin in case the TSVs and/or solid metal rings 30 deviate from the desired locations. The allowable range of distance S is further limited by design rules. Alternatively, openings 40 have substantially the same diameter (or width) as the respective solid metal rings 30, so that solid metal rings 30 adjoin the TSV formed in opening 40.

Figure 4:
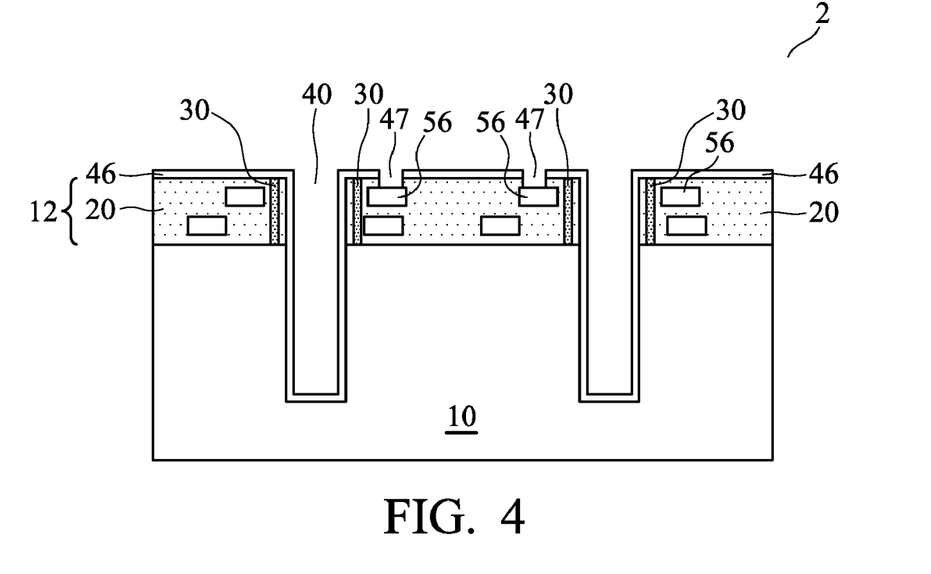

Referring again to FIG. 3, isolation layer 46 is blanket formed, wherein isolation layer 46 may be formed of silicon nitride or other applicable materials. The formation methods include plasma enhanced chemical vapor deposition (PECVD) or other commonly used CVD methods. Next, as shown in FIG. 4, openings 47 are formed in isolation layer 46 to expose the underlying bond pads 56.

Figure 5:
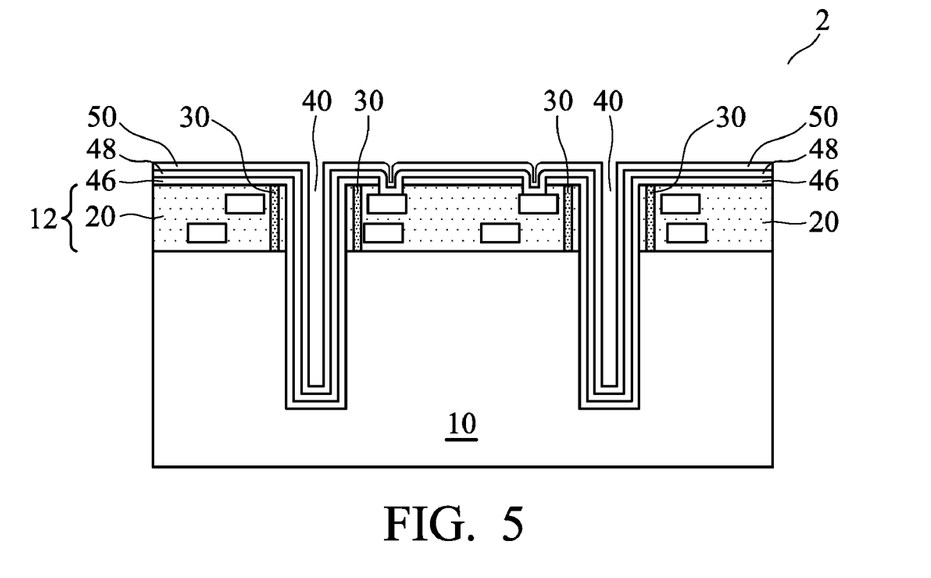

Referring to FIG. 5, barrier layer 48 and copper seed layer 50 are blanket formed. In an embodiment, barrier layer 48 is formed of tantalum nitride, although it may also be formed of other materials such as titanium nitride, tantalum, titanium, or the like. The formation methods include physical vapor deposition (PVD). Copper seed layer 50 may also be formed by PVD. Next, as shown in FIG. 6A, TSVs 52 are formed by filling openings 40. The filling process may include selectively covering non-TSV regions with a dry film, selectively plating copper into openings 40 and the desirable regions outside of openings 40, and removing the dry film. The filling process is well known in the art, and hence is not repeated herein. In an embodiment, the resulting structure includes post-passivation interconnects (PPIs) 54, which are also formed using the same process as forming TSVs 52. PPIs 54 may interconnect TSVs 52 to bond pads 56, which are further connected to the active circuits in chip 2. In alternative embodiments, one of TSVs 52 may not be connected to any of the bond pads 56, and are only used for connecting a chip over chip 2 to another chip under chip 2.

Figure 6C:
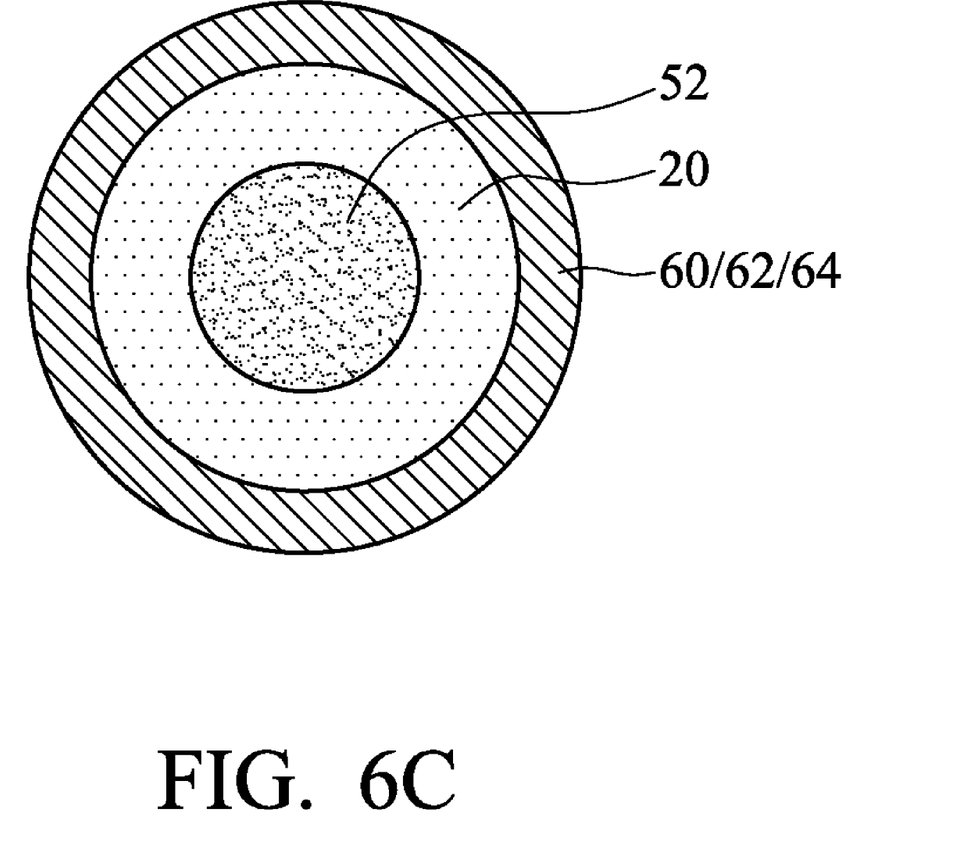
FIG. 6C illustrates a top view of the solid metal ring.

FIG. 6B illustrates a magnified cross-sectional view of region 32 (shown in FIG. 6A), which includes a portion of solid metal ring 30 therein. In the preferred embodiment, solid metal rings 30 include metal line rings 60 and via rings 62 (refer to FIG. 6C). Each of the metal line rings 60 forms a closed-loop ring with no openings therein. Accordingly, each of the solid metal rings 30 is a closed-loop ring, with no channel connecting the low-k dielectric material outside the solid metal rings 30 to the low-k dielectric material inside the solid metal rings 30. Please note that FIG. 6B is a cross-sectional view, and hence each of vias 62 may represent a via ring. Referring back to FIG. 3B, when opening 40 is formed, moisture and other detrimental chemicals may penetrate into the portions of low-k dielectric layers 20 encircled by solid metal rings 30. However, solid metal rings 30 block the moisture from penetrating into the portions of low-k dielectric layers 20 outside solid metal rings 30. As a result, solid metal rings 30 have the function of preventing the increase in leakage currents between metal lines 14.

Figure 7:
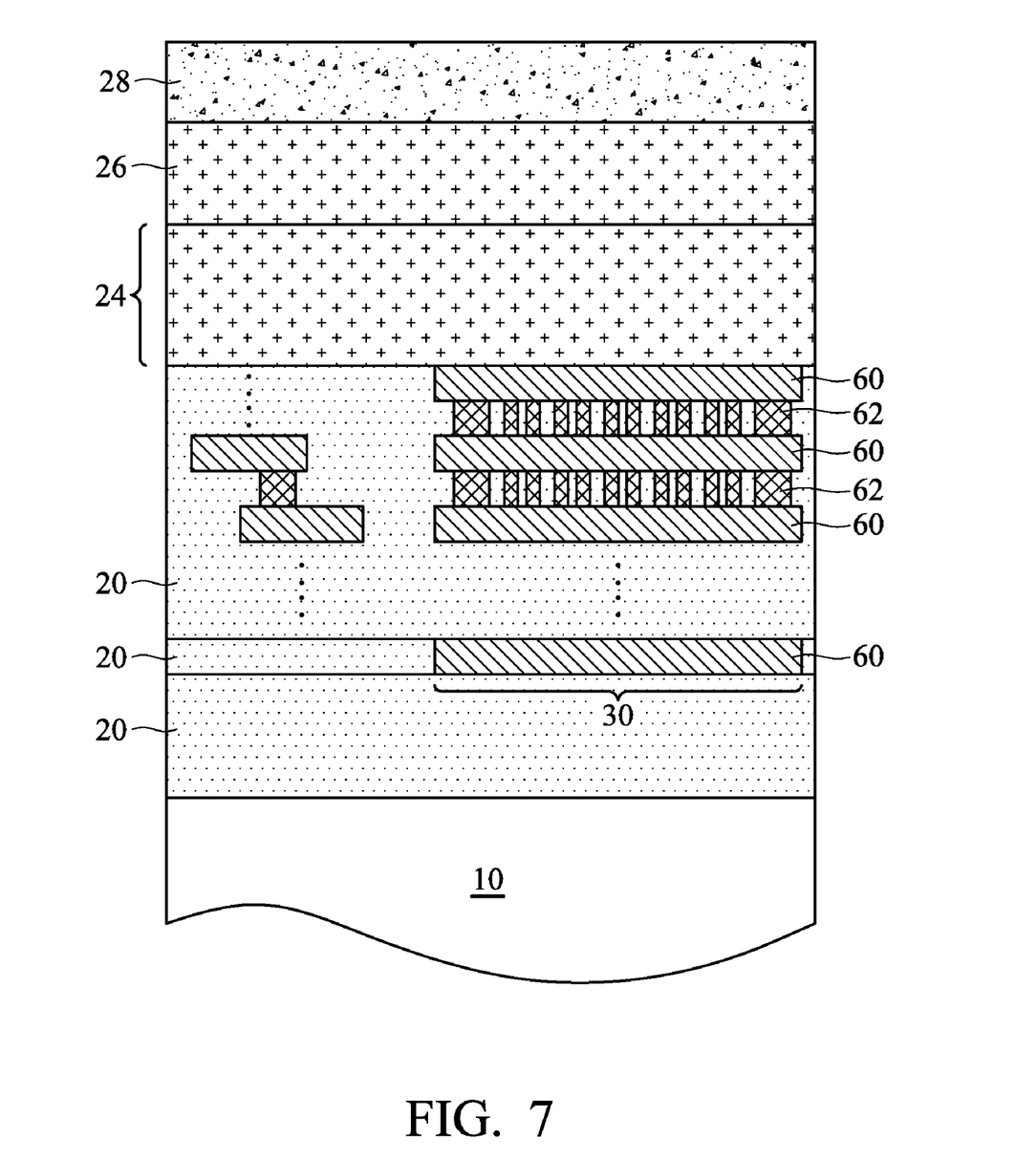
FIGS. 7 through 11 illustrate alternative embodiments of the present invention.
Figure 8:
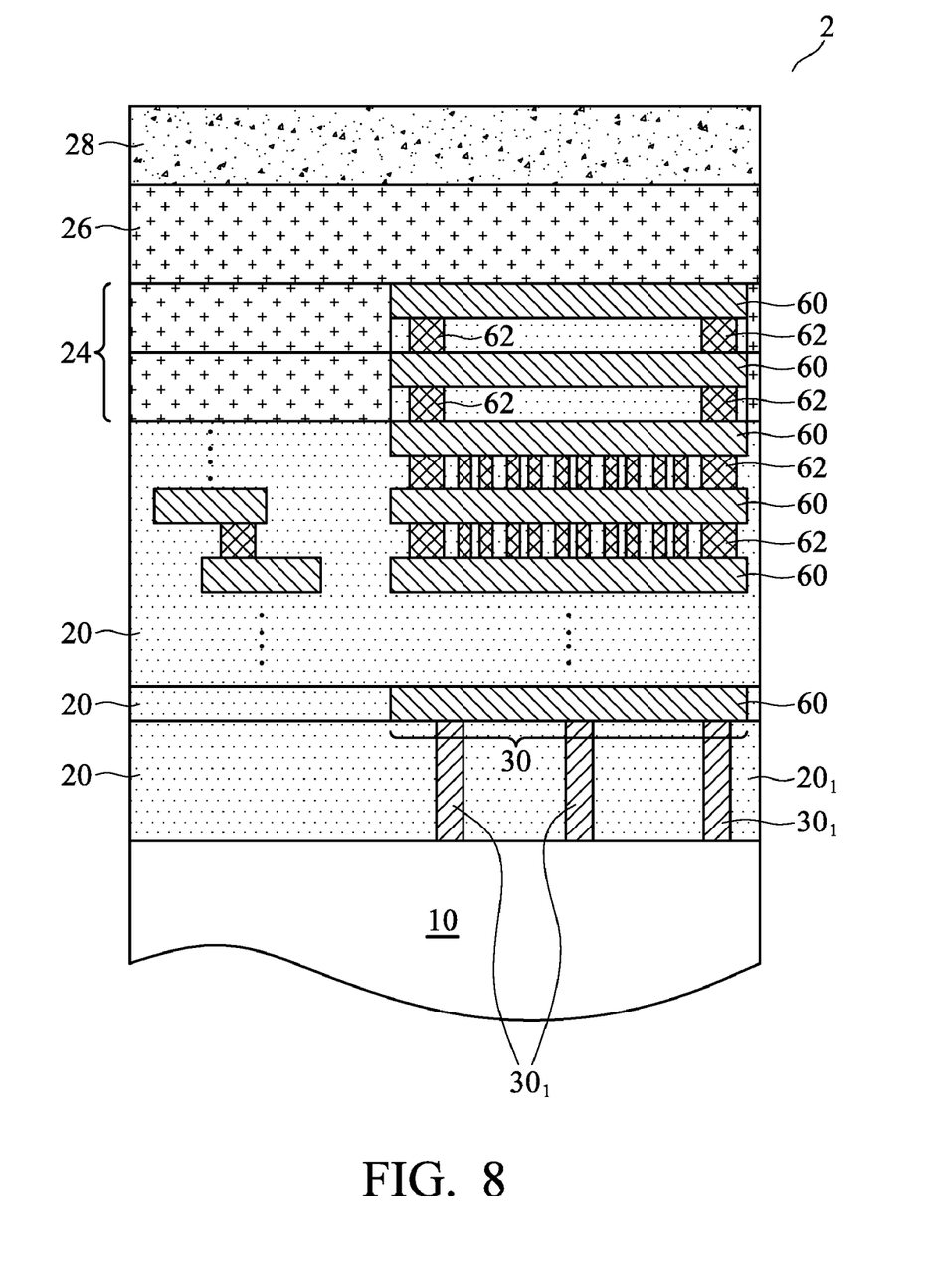

Referring back to FIG. 6B, the bottoms of solid metal rings 30 preferably extend into the bottom metallization layer (commonly known as M1). More preferably, solid metal rings 30 extend into inter-layer dielectric layer $20_1$, in which contact plugs (not shown), which are connected to active circuit 72 (symbolized by a transistor), are formed. Further, solid metal rings 30 may include contact plug rings $30_1$ contacting semiconductor substrate 10. The top surface of solid metal rings 30 is preferably no lower than the top surface of low-k dielectric layers 20. Accordingly, the top surface of solid metal rings 30 may be substantially level with the bottom surface of the non-low-k dielectric layers, such as USG layers 24 as shown in FIG. 7. Alternatively, as shown in FIG. 8, solid metal rings 30 further include portions 60 and 62 in USG layers 24, but not in passivation layers 26 and 28. In yet other embodiments, as already shown in FIG. 6B, solid metal rings 30 further include pad rings 64, which are formed simultaneously with bond pads 56, which are exposed through the top surface of chip 2. A top view of solid metal rings 30 is shown in FIG. 6C.

Figure 9:
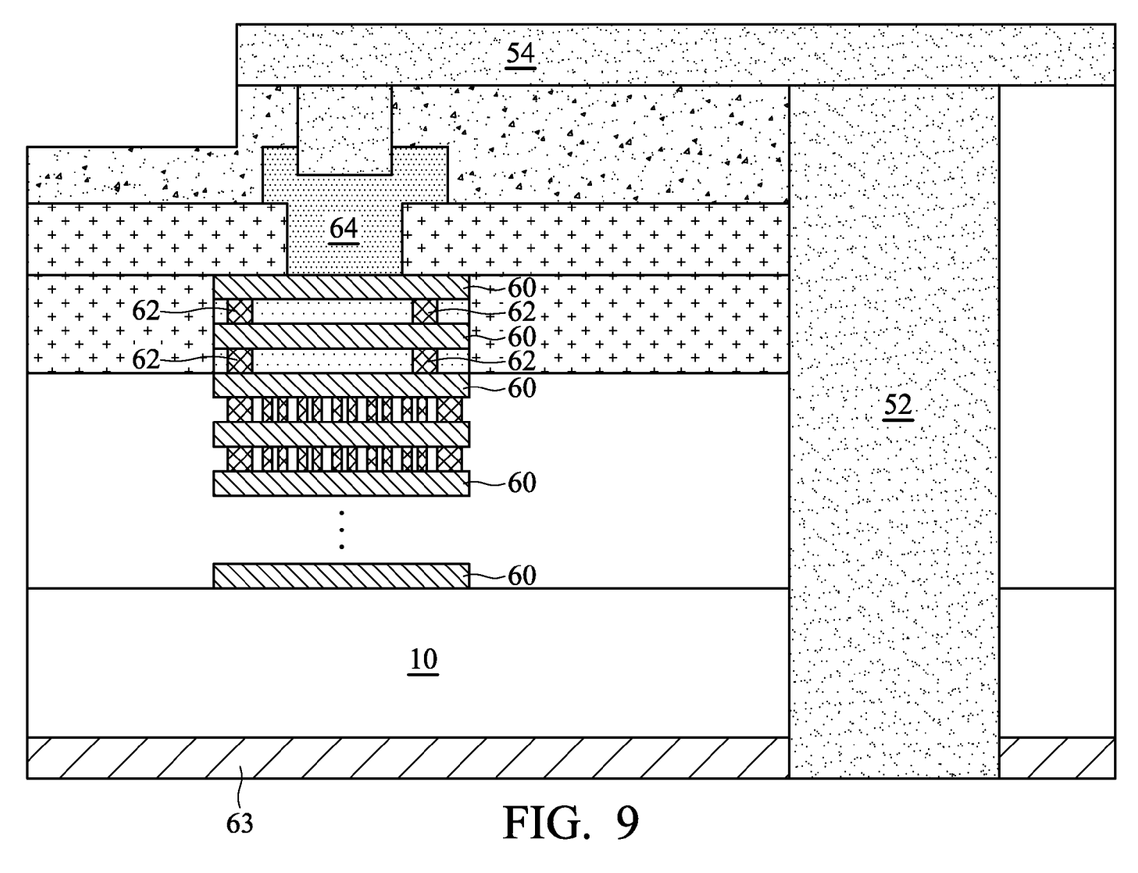

One of TSVs 52 in chip 2 may be grounded through the respective encircling solid metal ring 30, as shown in FIG. 9. In this case, PPI 54 connects TSV 52 to its respective encircling solid metal ring 30. PPI 54 is further connected to pad ring 64 via the interconnections in USG layers 24 (metal lines 60 and vias 62). Through such a connection, TSV 52 may act as a grounding path to connect the ground, which may be a metal film 63 on the back of substrate 10, to the integrated circuits in substrate 10.

Figure 10:
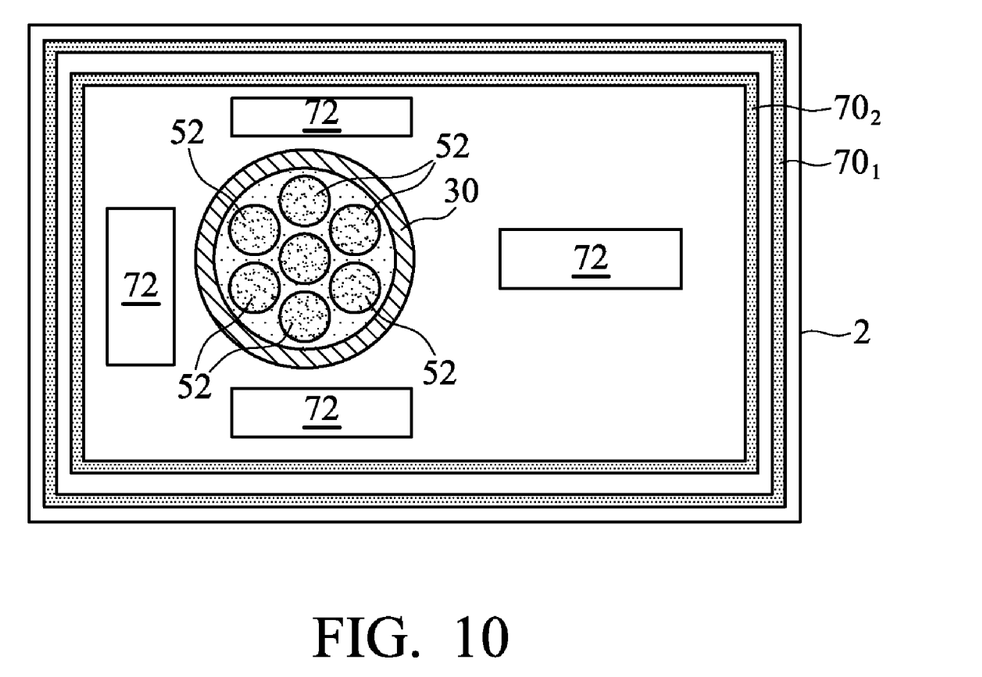
Figure 11:
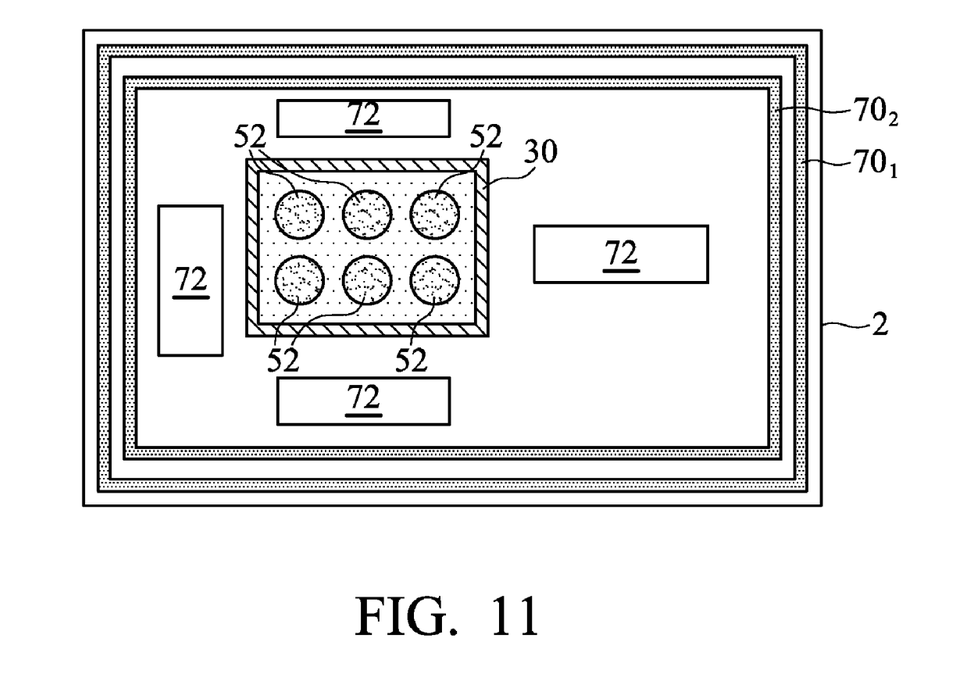

FIGS. 10 and 11 illustrate additional embodiments wherein a plurality of TSVs 52 is encircled by a common solid metal ring 30. In an embodiment, solid metal ring 30 may be grounded, for example, either through one of the TSVs inside solid metal ring 30 or through another grounded bond pad (not shown) outside solid metal ring 30. Accordingly, solid metal ring 30 acts as a shielding structure for cross-talk prevention. The TSVs 52 inside solid metal ring 30 may thus carry high-frequency signals without the concern of affecting integrated circuit 72 outside of solid metal ring 30.

Preferably, inside each solid metal ring 30, no active circuits and no metal lines and vias are formed, and solid metal rings 30 occupy as little chip area as possible. Solid metal rings 30 are thus different from the commonly known seal rings 70 (which may include sacrificial seal ring $70_1$ and main seal ring $70_2$) that, if exist, will be formed close to the edges of chip 2. Further, active circuits 72 will be formed outside solid metal rings 30, and between solid metal rings 30 and seal rings 70. Solid metal rings 30 may have different shapes. For example, FIG. 10 illustrates a circular solid metal ring 30, while FIG. 11 illustrates a rectangular solid metal ring 30.

The embodiments of the present invention have several advantageous features. By forming solid metal rings in low-k dielectric layers and encircling TSVs, the possible degradation to the low-k dielectric layers during the formation of TSVs is essentially eliminated. This prevents the increase in leakage currents between metal lines in low-k dielectric layers. The embodiments of the present invention do not require any additional masks and process steps, and hence there is no additional manufacturing cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   an interconnect structure overlying the semiconductor substrate;
   a solid metal ring in the interconnect structure, wherein substantially no active circuit is inside the solid metal ring; and
   a through-silicon via (TSV) comprising a portion encircled by the solid metal ring, wherein the TSV extends through the interconnect structure into the semiconductor substrate, and wherein the solid metal ring and the TSV are interconnected and are grounded.

2. The integrated circuit structure of claim 1, wherein the interconnect structure comprises low-k dielectric layers, and non-low-k dielectric layers over the low-k dielectric layers, and wherein the solid metal ring has a top surface no lower than an interface between the low-k dielectric layers and the non-low-k dielectric layers.

3. The integrated circuit structure of claim 2, wherein the solid metal ring extends into an inter-layer dielectric for forming contact plugs therein.

4. The integrated circuit structure of claim 2 further comprising an un-doped silicate glass (USG) layer over the low-k dielectric layers, wherein the solid metal ring further extends into the USG layer.

5. The integrated circuit structure of claim 2 further comprising:
   a bond pad; and
   a passivation layer over the low-k dielectric layers, wherein the solid metal ring further comprises a pad ring extending into the passivation layer, and wherein the pad ring is at a same level and comprises same materials as the bond pad.

6. The integrated circuit structure of claim 1 further comprising:
   a bond pad outside of the solid metal ring; and
   a post-passivation interconnect (PPI) over and interconnecting the TSV and the bond pad, wherein the PPI is over and electrically disconnected from the solid metal ring.

7. The integrated circuit structure of claim 1 further comprising an additional TSV encircled by the solid metal ring.

8. An integrated circuit structure comprising:
   a semiconductor chip comprising:
      a semiconductor substrate;
      a plurality of low-k dielectric layers overlying the semiconductor substrate;

a non-low-k dielectric layer overlying the plurality of low-k dielectric layers, wherein the non-low-k dielectric layer and the plurality of low-k dielectric layers have an interface;

a through-silicon via (TSV) extending from a top surface of the non-low-k dielectric layer into the semiconductor substrate;

a solid metal ring in the plurality of low-k dielectric layers and forming a closed-loop ring encircling the TSV, wherein the solid metal ring has a top surface no lower than the interface, and wherein the solid metal ring extends at least into a bottom one, of the plurality of, low-k dielectric layers;

a seal ring encircling the solid metal ring and adjacent edges of the semiconductor chip; and an active circuit between the seal ring and the solid metal ring.

9. The integrated circuit structure of claim 8, wherein the solid metal ring further extends into an inter-layer dielectric layer over the semiconductor substrate.

10. The integrated circuit structure of claim 9, wherein the solid metal ring is in contact with the semiconductor substrate.

11. The integrated circuit structure of claim 8, wherein, in each of the plurality of low-k dielectric layers, the solid metal ring comprises a metal line ring and a via ring.

12. The integrated circuit structure of claim 8, wherein the solid metal ring and the TSV are interconnected and are grounded.

13. The integrated circuit structure of claim 8 further comprising:

a bond pad outside of the solid metal ring; and a post-passivation interconnect (PPI) over and interconnecting the TSV and the bond pad, wherein the PPI is over and electrically disconnected from the solid metal ring.

14. The integrated circuit structure of claim 8 further comprising an additional TSV in the solid metal ring.

15. The integrated circuit structure of claim 8 further comprising an additional seal ring encircling the seal ring and adjacent edges of the semiconductor chip.

16. An integrated circuit structure comprising:

a semiconductor substrate;

an interconnect structure overlying the semiconductor substrate;

a solid metal ring in the interconnect structure, wherein substantially no active circuit is inside the solid metal ring; and a plurality of through-silicon vias (TSVs) encircled by the solid metal ring, wherein the plurality of TSVs extends through the interconnect structure and into the semiconductor substrate, and wherein one of the plurality of TSVs is connected to the solid metal ring and is grounded.

17. The integrated circuit structure of claim 16, wherein the solid metal ring has a circular top view.

18. The integrated circuit structure of claim 16, wherein each of the plurality of TSVs extends through the interconnect structure and extends into the semiconductor substrate.

* * * * *